US011075503B2

(12) United States Patent
Price et al.

(10) Patent No.: US 11,075,503 B2
(45) Date of Patent: Jul. 27, 2021

(54) INTEGRATED INTER-CAVITY PHOTODETECTOR FOR LASER POWER AND THRESHOLD ESTIMATION

(71) Applicant: MICROSOFT TECHNOLOGY LICENSING, LLC, Redmond, WA (US)

(72) Inventors: Raymond Kirk Price, Redmond, WA (US); Yarn Chee Poon, Sammamish, WA (US); Gambhir Ranjit, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 16 days.

(21) Appl. No.: 16/460,718

(22) Filed: Jul. 2, 2019

(65) Prior Publication Data
US 2021/0006035 A1 Jan. 7, 2021

(51) Int. Cl.
*H01S 5/40* (2006.01)
*H01S 5/0683* (2006.01)
*H01S 5/042* (2006.01)

(52) U.S. Cl.
CPC ............ *H01S 5/0683* (2013.01); *H01S 5/042* (2013.01); *H01S 5/4012* (2013.01); *H01S 5/4093* (2013.01)

(58) Field of Classification Search
CPC ...... H01S 5/0683; H01S 5/4093; H01S 5/042; H01S 5/4012; H01S 5/16; H01S 5/1039; H01S 5/0071; H01S 5/0264; H01S 5/0625
See application file for complete search history.

(56) References Cited

U.S. PATENT DOCUMENTS

| 5,023,878 | A | * | 6/1991 | Berthold | ............... B82Y 20/00 372/20 |
| 5,287,376 | A | | 2/1994 | Paoli | |
| 5,299,057 | A | * | 3/1994 | Rideout | ............... H01S 5/0264 257/431 |
| 6,226,309 | B1 | | 5/2001 | Tsubota | |
| 6,838,743 | B2 | | 1/2005 | Yamada et al. | |
| 7,254,148 | B2 | | 8/2007 | Masuda | |
| 8,444,275 | B2 | | 5/2013 | Kurtz et al. | |
| 8,629,815 | B2 | | 1/2014 | Brin et al. | |
| 9,383,582 | B2 | | 7/2016 | Tang et al. | |

(Continued)

OTHER PUBLICATIONS

Katagiri, et al., "A Monolithic Three-Channel LD-PD Array with Vertically Staggered Facets for Autofocusing Reflectivity Sensors", In Journal of Photonics Technology Letters vol. 4, Issue 5, May 1, 1992, pp. 476-479.

(Continued)

*Primary Examiner* — Xinning(Tom) Niu
(74) *Attorney, Agent, or Firm* — Workman Nydegger

(57) ABSTRACT

A multi-section laser device is configured with a gain section and an integrated photodetector section. The photodetector section, rather than being a separate component, is integrated directly into the body of the laser. The integrated photodetector section absorbs photons generated by the gain section and creates a photocurrent that is proportional to the output of the multi-section laser device. The measured photocurrent is usable to calculate power output of the multi-section laser device and to identify any adjustments that may be needed to be made to the laser in order to achieve desired laser light output.

20 Claims, 14 Drawing Sheets

(56) References Cited

U.S. PATENT DOCUMENTS

| | | | |
|---|---|---|---|
| 9,871,350 B2 | 1/2018 | McLaurin et al. | |
| 10,234,267 B2 | 3/2019 | Cable et al. | |
| 10,254,547 B2 | 4/2019 | Tremblay et al. | |
| 2003/0128365 A1* | 7/2003 | Strandjord | G01C 19/721 356/460 |
| 2005/0230722 A1 | 10/2005 | Najda | |
| 2008/0310470 A1* | 12/2008 | Ooi | H01S 5/341 372/44.01 |
| 2009/0160833 A1 | 6/2009 | Brown et al. | |
| 2017/0164449 A1* | 6/2017 | Shimizu | B60K 35/00 |
| 2019/0036293 A1 | 1/2019 | Kobayashi et al. | |

OTHER PUBLICATIONS

"International Search Report and Written Opinion Issued in PCT Application No. PCT/US20/036540", dated Aug. 27, 2020, 13 Pages.

Shen, et al., "Semipolar III—Nitride Quantum well Waveguide Photodetector Integrated with Laser Diode for on-chip Photonic System", In Journal of Applied Physics Express vol. 10, Issue 4, Feb. 28, 2017, 4 Pages.

Uchida, et al., "An Integrated AlGaAs Two-Beam Laser Diode-Photodiode Array Fabricated with Reactive Ion Beam Etching", In Journal of Electronics and Communications in Japan, Part—II, vol. 72, Issue 4, Apr. 1, 1989, pp. 33-43.

\* cited by examiner

INTEGRATED INTER-CAVITY PHOTODETECTOR FOR LASER POWER AND THRESHOLD ESTIMATION

BACKGROUND OF THE INVENTION

Mixed-reality systems, including virtual-reality (VR) and augmented-reality (AR) systems, have received significant attention because of their ability to create truly unique experiences for their users. For reference, conventional VR systems create a completely immersive experience by restricting their users' views to only virtual environments. This is often achieved through the use of a head-mounted device (HMD) that completely blocks any view of the real world. As a result, a user is entirely immersed within the virtual environment. In contrast, conventional AR systems create an augmented-reality experience by visually presenting virtual images (i.e. "holograms") that are placed in or that interact with the real world.

As used herein, VR and AR systems are described and referenced interchangeably. Unless stated otherwise, the descriptions herein apply equally to all types of mixed-reality systems, which (as detailed above) include AR systems, VR systems, and/or any other similar system capable of displaying virtual images. As used herein, the term "virtual image" collectively refers to images rendered within a VR environment as well as images/holograms rendered in an AR environment.

Some disclosed mixed-reality systems use one or more on-body devices (e.g., the HMD, a handheld device, etc.). The HMD provides a display that enables a user to view overlapping and/or integrated visual information (e.g., holograms) in whatever environment the user is in, be it a VR environment, an AR environment, or any other type of environment.

Mixed-reality images are typically generated with compact light modules that incorporate light emitting devices, such as, for example, laser diodes that are activated/pulsed at precise intervals though one or more optics, and that are configured to render/display the laser light as pixels within an image. Different systems, such as scanning MEMS (Micro-Electro-Mechanical System) mirrors are also used, in some instances, to distribute the light from the lasers to each pixel in each frame that is rendered as part of the mixed-reality images.

Continued advances in hardware capabilities, such as laser diodes and MEMS, have greatly improved how mixed-reality systems render holograms. Notwithstanding these advances, however, there are still many challenges, difficulties, and costs associated with rendering high-quality images in mixed-reality environments.

For instance, in order to render each pixel of each image with the proper coloring/intensities, it is necessary to precisely measure and calibrate the different laser light output from each of the different laser diodes. Due to the manner in which the HMD system can be moved during use, and the manner in which the compact design can be affected by temperature fluctuations, it is necessary to measure and calibrate the laser diodes iteratively during use of the HMDS.

One way to measure light from laser diodes is with photodetectors. In fact, it is typical for existing HMD systems to incorporate separate photodetectors for each laser diode. It will be appreciated, however, that the use of separate photodetectors (or any other sensor or component) with the compact design of the HMD system can significantly impact the overall cost of the HMD.

Incorporating large quantities of separate parts in the HMD systems (such as separate sensors and other components) can also consume valuable space within the compact HMD device. In some instances, the HMD headsets have to be designed with enlarged housings to incorporate all of the different components, thereby making them more cumbersome to wear and, potentially, limiting the enjoyment of the experience for users.

In view of the foregoing, it will be appreciated that there is an ongoing need to optimize the configuration of components within HMD systems as efficiently as possible.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Disclosed embodiments include systems, methods, and devices configured to measure and control laser output of a multi-section laser device with uniquely configured photodetectors that are integrated into the laser diodes. In some embodiments, the multi-section laser device includes a plurality of laser diodes, wherein each of the laser diodes has its own integrated photodetector section built into the laser diode, respectively. In some instances, the integrated photodetector components replace separate individual photodiodes that would otherwise consume valuable space within a mixed-reality head-mounted device (HMD).

In some embodiments, a multi-section laser device includes laser driver circuitry and is configured with one or more of red, green, or blue light (RGB) transmitting through a gain section and a photodetector section separated by an electrical isolation gap. Both sections are electrically connected to a diode laser resonator, where the gain section is electrically biased in the forward direction and the photodetector section is electrically biased in the reverse direction. As the multi-section laser device laser turns on, the laser light travels through the diode laser resonator and into the connected gain section. The laser output facet outputs photons proportional to the number of photons in the laser resonator. The photodetector section collects a portion of the photons from the gain section to generate a photocurrent. In this manner, the photodetector section operates as a photodetector for measuring the performance of the laser (e.g., the attributes of the laser light). These measurements can then be used, if necessary, to calibrate the laser during use.

In some embodiments, the photodetector section is incorporated into a red laser diode, a green laser diode, a blue laser diode and/or an infrared laser diode of a multi-section laser.

In some embodiments, the photodetector section is positioned between the gain section and the light emitting facet of the multi-section laser device. This configuration will cause the laser light to travel through the gain section first, before traveling through the photodetector section for measurement.

In some embodiments, the gain section is positioned between the photodetector section and the light emitting facet of the multi-section laser device. This configuration will cause the laser light to travel through the photodetector section first, where the power output is measured, before traveling through the gain section.

In these embodiments the multi-section laser can have an unpumped section, in which the gain section and/or the photodetector sections will be positioned to meet the inner edge of the unpumped section.

In some embodiments, the photodetector section is positioned between two sections of the gain section, the first gain section and the second gain section. This configuration will cause the laser light to travel through some portion of the gain section prior to being measured by the photodetector section.

In some instances, after the photocurrent is generated, the output power of the laser is calculated using a tramsimpedance amplifier and an ADC (analog to digital converter) to use the calculated laser output to adjust the output of the laser.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION OF THE PREFERRED EMBODIMENTS

Disclosed embodiments include systems, methods, and devices configured to control laser output of a multi-section laser device having an integrated photodetector section.

The term "multi-section laser device" is sometimes used interchangeably herein, as a "multi-section laser," "multi-section laser diode," "laser diode" and/or "laser."

In some instances, the integrated photodetector replaces separate individual photodiodes that would otherwise consume valuable space within mixed-reality head-mounted device (HMD) systems, thereby optimizing the space within the HMD systems.

In some embodiments, a multi-section laser includes laser driver circuitry. The laser is further configured with one or more of red, green and/or blue light (RGB) transmitting through a gain section and a photodetector section separated by an electrical isolation gap. Both sections are electrically connected to a diode laser resonator, where the gain section is electrically biased in the forward direction and the photodetector section is electrically biased in the reverse direction. As the multi-section laser device laser turns on, the laser light travels within the diode laser resonator and into the connected gain section. The laser facet outputs laser power proportional to the number of photons in the laser cavity/resonator. The photodetector section collects a portion of the photons from the gain section to generate a photocurrent. In this manner, the photodetector section operates as a photodetector for measuring the performance of the laser (e.g., the attributes of the laser light).

The measurements taken from the integrated photodetector sections can be used to verify/calibrate the laser performance during use and without requiring the use of separate photodetectors that are physically separated from the laser diodes they are measuring. The use of the integrated photodetectors can help optimize the layout of the HMD components within the spatial constraints of the HMD (which in turn can help improve the form factor and overall comfort and ease of wearing the HMD) and can also help to reduce the overall costs associated with manufacture of the HMD.

Figure 1A:
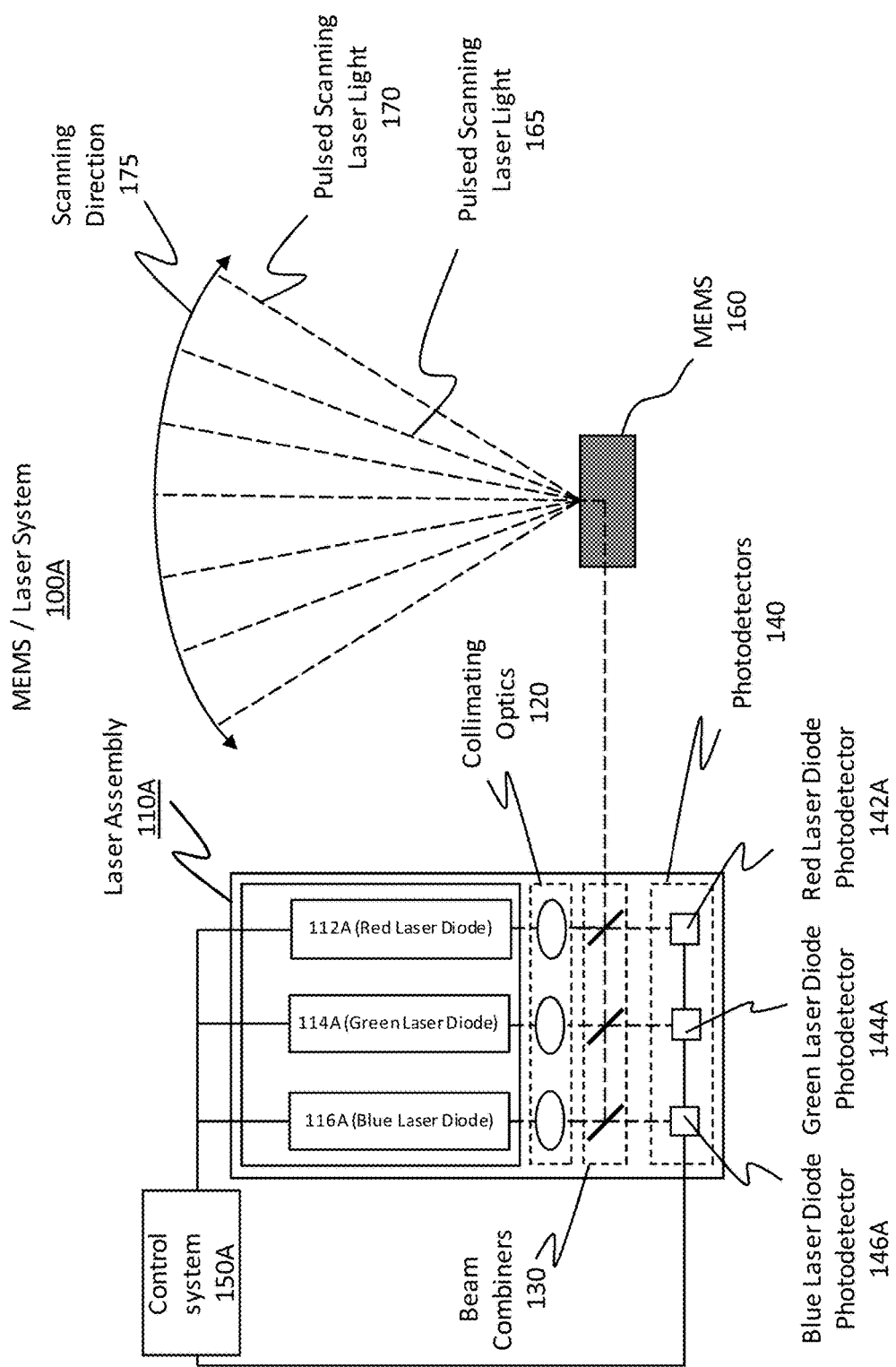
FIG. 1A illustrates an example of a laser system that uses photodiodes to control the power output of the laser/illuminators.

Attention is now directed to FIG. 1A, which illustrates an existing MEMS laser system that can be used with HMD systems and other mixed-reality systems. As shown, a laser assembly 110A is configured with at least one light emitting device, as shown in this embodiment, a red laser diode 112A, a green laser diode 114A, and a blue laser diode 116A.

In some existing configurations, such as the one shown in FIG. 1, the laser light emitted from the lasers 112A, 114A and 116A is spectrally combined to form a single collimated beam of red, green and blue (RGB) laser light by projecting the light through collimating optics 120 and a beam combiner 130. It will be appreciated that laser light emitted from the beam combiner 130 to the MEMS 160 may be a continuous beam of laser light, or, alternatively, it may be a pulsed beam of laser light.

In FIG. 1A, a portion of the light emitted from the red 112A, green 114A and blue 116A laser diodes through the collimating optics 120, is allowed through the beam combiners 130 for the purposes of measuring the attributes of the emitted light from each of the lasers to determine whether any calibration/adjustment needs to be made to the lasers and/or when pulsing the lasers to ensure the light has the proper attributes to generate the desired imaging.

In some instances, the light that passes through the beam combiners 130 to be measured is detected at and measured by a corresponding photodetector 140. For example, the measurement from the red laser diode photodetector 142A, green laser diode photodetector 144A or blue laser diode photodetector 146A can be fed back through a control system 150A and be used to adjust the power output of any one of the red 112A, green 114A or blue 116A laser diodes.

In other existing configurations, not shown, separate photodetectors capture light that is redirected through reflecting prisms and/or other optics to the photodetectors. The photodetectors can be positioned separately from the prisms/optics and or within the optics/prisms. For instance, a prism may allow a small amount of laser light leakage to be passed to and absorbed by a photodetector inside the prism, while redirecting other light to the other imaging optics/display components.

As shown in FIG. 1A, laser light emitted from laser assembly 110A is typically directed to a microelectromechanical scanning ("MEMS") mirror system 160. The MEMS mirror system 160 includes a multi-directional mirror array that is able to rapidly redirect and aim laser light to any desired pixel location. For example, scanning direction 175 shows how the MEMS mirror system 160 is able to rapidly redirect pulsed (or continuous) scanning laser light 165 and pulsed scanning laser light 170 to any location. Here, pulsed scanning laser light 165 and 170 originates from the laser light from the laser assembly 110A. While only two instances of the pulsed scanning laser light (e.g., 165 and 170) are labeled, it will be appreciated that the MEMS mirror system 160 is able to redirect any number of pulsed emissions. By scanning laser light back and forth horizontally and up and down vertically, the MEMS/laser unit 100A is able to illuminate individual pixels of a virtual image within a desired field of view (to be discussed in more detail later). Because the MEMS/laser unit 100A is able to illuminate individual pixels so rapidly, the MEMS/laser unit 100A is able to render an entire virtual image for a user to view and interact with without the user realizing that the virtual image was progressively generated by scanning individual pixels.

The laser light used to render each pixel can be tuned by the control system 150A to provide the desired intensity and color properties for generating the image. In some instances, this requires tuning of the lasers and power supplied to the lasers, based on detected light properties, such as those detected with the photodetectors.

Unfortunately, as discussed above, current configurations (such as the one shown in FIG. 1A) requires the use of separate photodetectors 140 to measure/detect the light properties, such as the illustrated red laser diode photodetector 142A, green laser diode photodetector 144A and blue laser diode photodetector 146A.

As previously mentioned, the use of separate photodetectors 140, increases the cost and space required for the laser assembly 110A, which is problematic in a compact space such as a HMD, even though photodetectors are important for providing/controlling the precision of the lasers when generating high-quality images.

The current invention provides embodiments for integrating the necessary photodetector functionality directly into the laser diodes, thereby freeing up valuable space that is otherwise consumed by separate photodetectors.

Figure 1B:
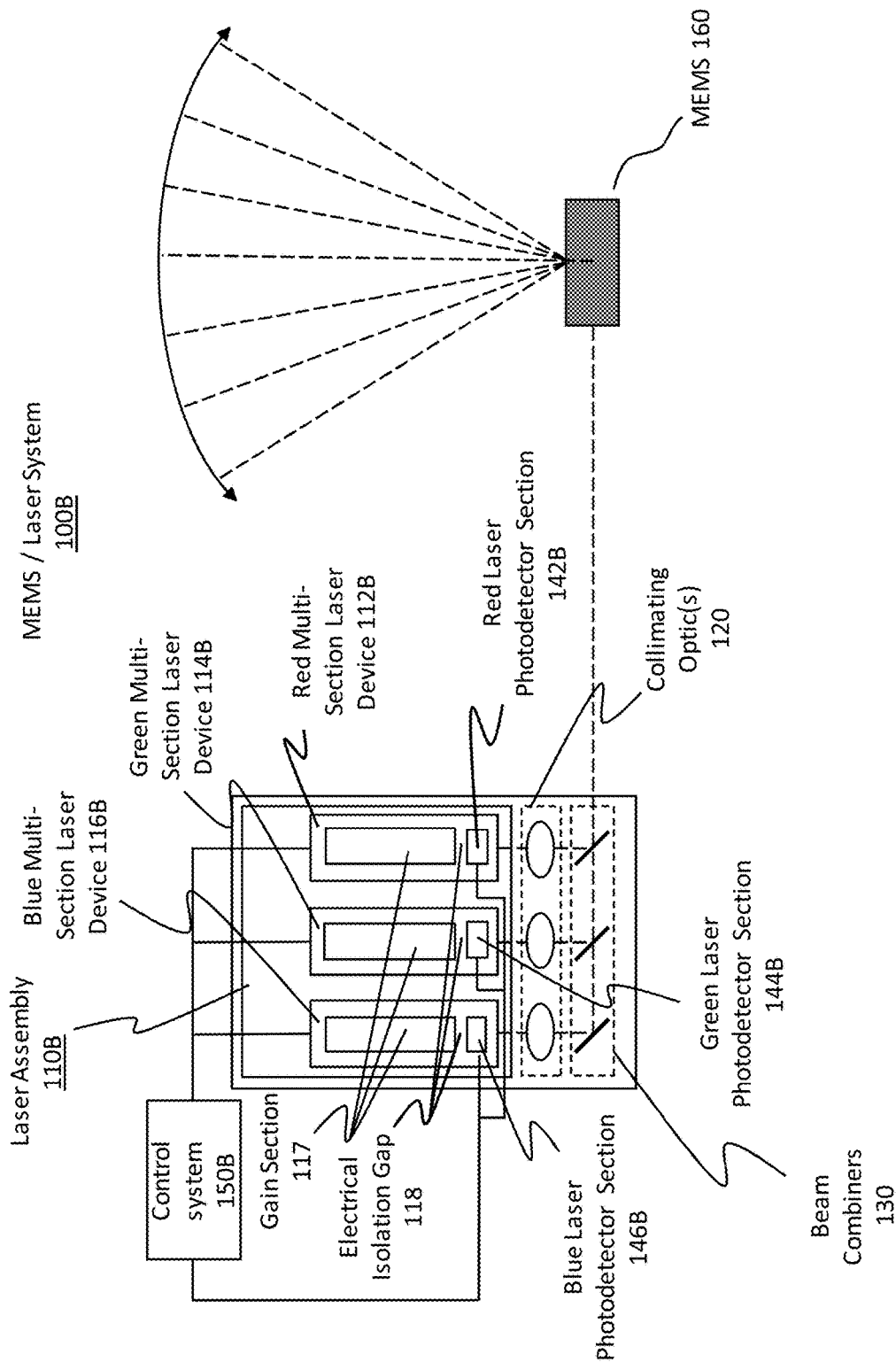
FIG. 1B illustrates an example of a multi-section laser device system that uses an integrated photodetector section to control the power output of the laser/illuminators.

One embodiment of a system that integrates the photodetectors directly into the laser diodes is shown in FIG. 1B. For instance, as shown, the laser system 100B includes a laser assembly 110B with a red multi-section laser device 112B, a green multi-section laser device 114B and a blue multi-section laser device 116B, wherein each of the multi-section laser devices 112B, 114B and 116B, contains a corresponding gain section 117, electrical isolation gap 118 and integrated photodetector section. For example, the red multi-section laser device 112B includes a red laser photodetector section 142B, the green multi-section laser device 112B includes a green laser photodetector section 144B and the blue multi-section laser device 112B includes a blue laser photodetector section 146B.

The electrical isolation gap 118, included in each of the multi-section lasers, provides space to electrically insulate/separate the electrically forward biased gain section 117 (which amplifies the laser light) from the electrically reverse biased photodetector section 142B, 144B or 146B (which are used to identify a photocurrent of the corresponding laser diode/laser light).

In particular, the photodetector sections 142B, 144B or 146B can be used to create a photocurrent that is provided to the control system 150B, to cause the control system 150B to validate a desired power output, and/or to adjust the power output to the desired power output, for any one of the multi-section laser devices 112B, 114B or 116B. In this manner, the control system 150B can be used with the integrated photodetectors to control/calibrate the individual laser diodes during use.

The control system 150B can be include various hardware and software configurations that are capable of receiving an input photocurrent, determining if the received photocurrent is appropriate/desired, based on current conditions and pre-configured/mapped settings, and/or to adjust the power/current supplied to the multi-section laser device 112B, 114B or 116B to achieve the desired laser attributes/functionality.

In some instances, the multi-section laser diodes emit light that travels through the one or more collimating optics 120B and to the beam combiners 130 for creation single light beam. The laser light exiting from the laser assembly 110B is transmitted to a MEMS 160 for display, as described above.

Figure 1C:
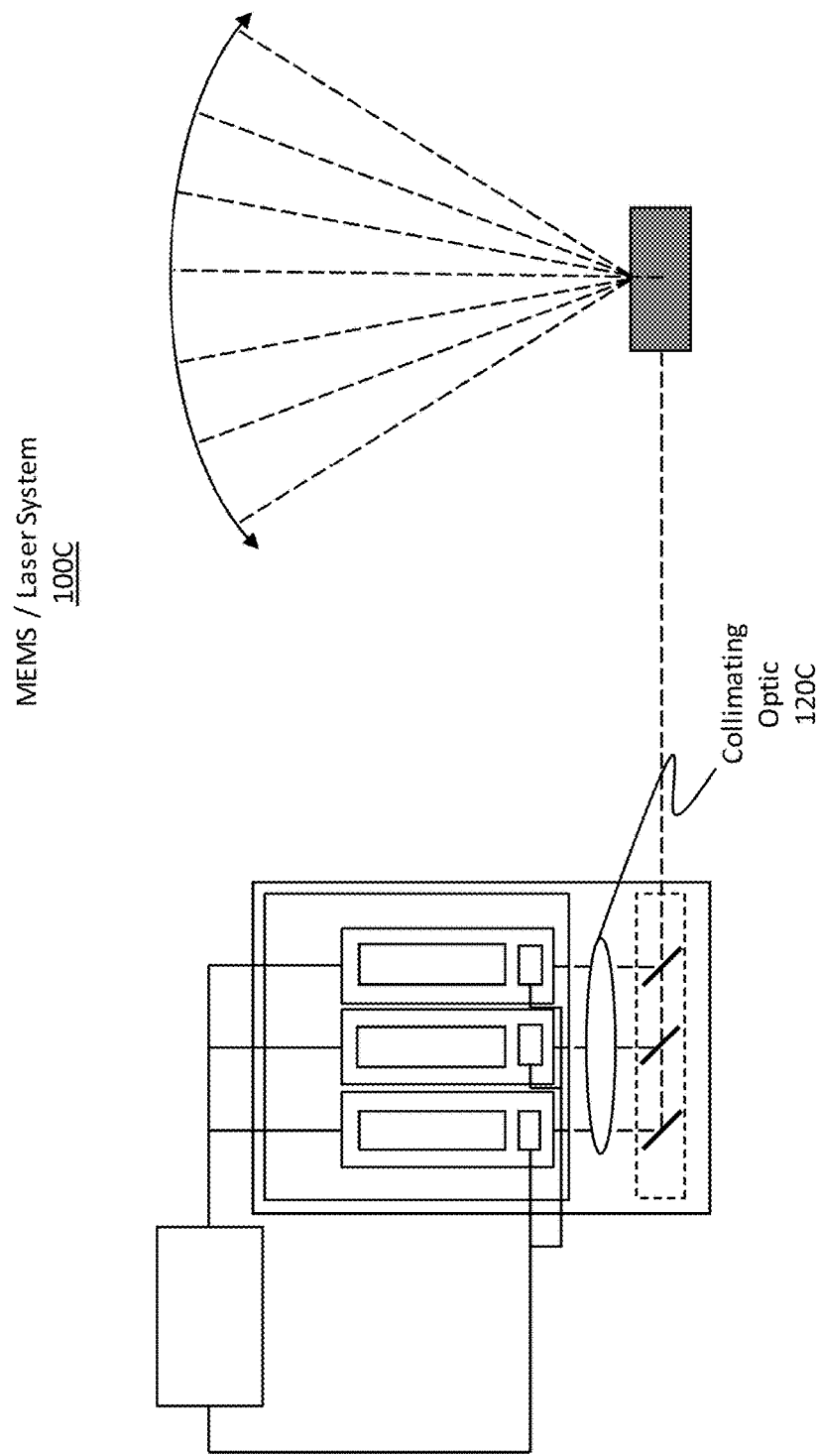
FIG. 1C illustrates an example of a multi-section laser device system that uses a single collimating optic.

FIG. 1C shows a configuration, similar to that of FIG. 1B, but wherein the separate collimating optics are replaced with a single collimating optic 120C. This configuration may be desirable, for example, to further reduce components within the system and because photodetection is integrated into each of the multi-section laser devices, such that there is no longer a need for separate collimators to create space for eliminating cross-talk between different/separate photodetectors (as would be required for some existing systems).

Figure 2B:
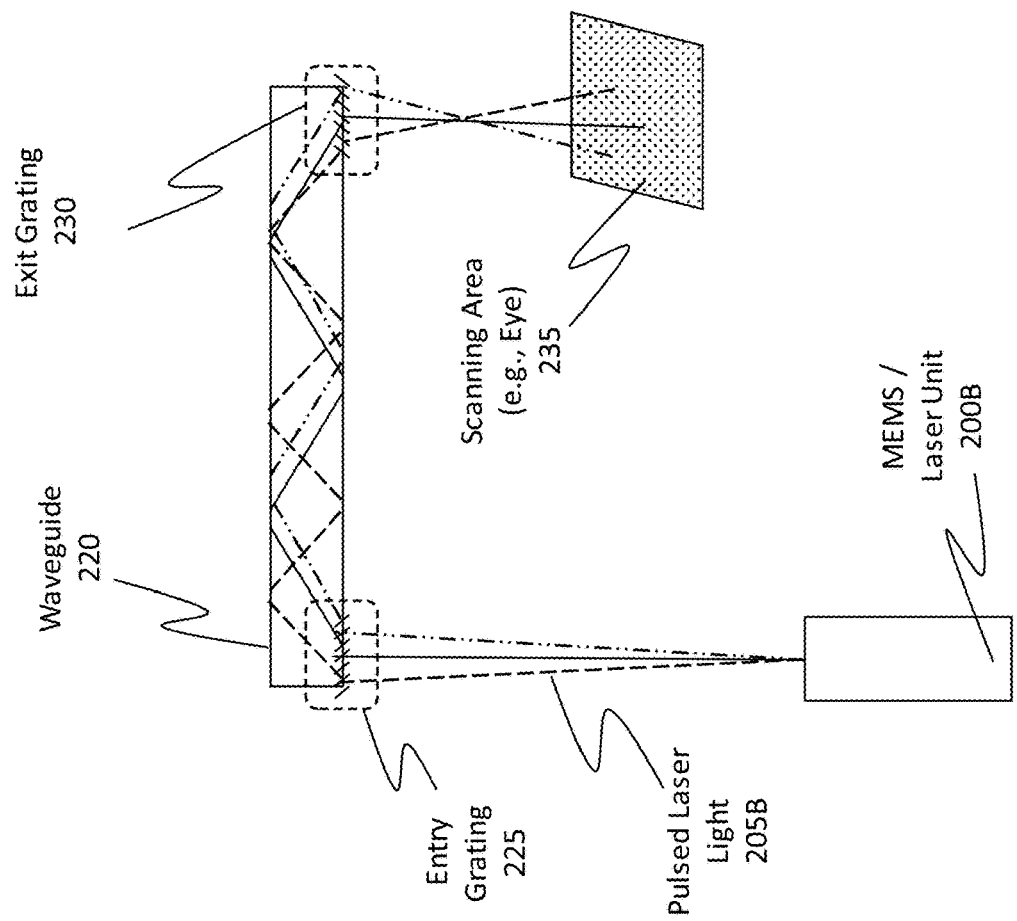
FIG. 2B illustrates an augmented reality display system which can include or be used with the disclosed multi-section laser devices.
Figure 2A:
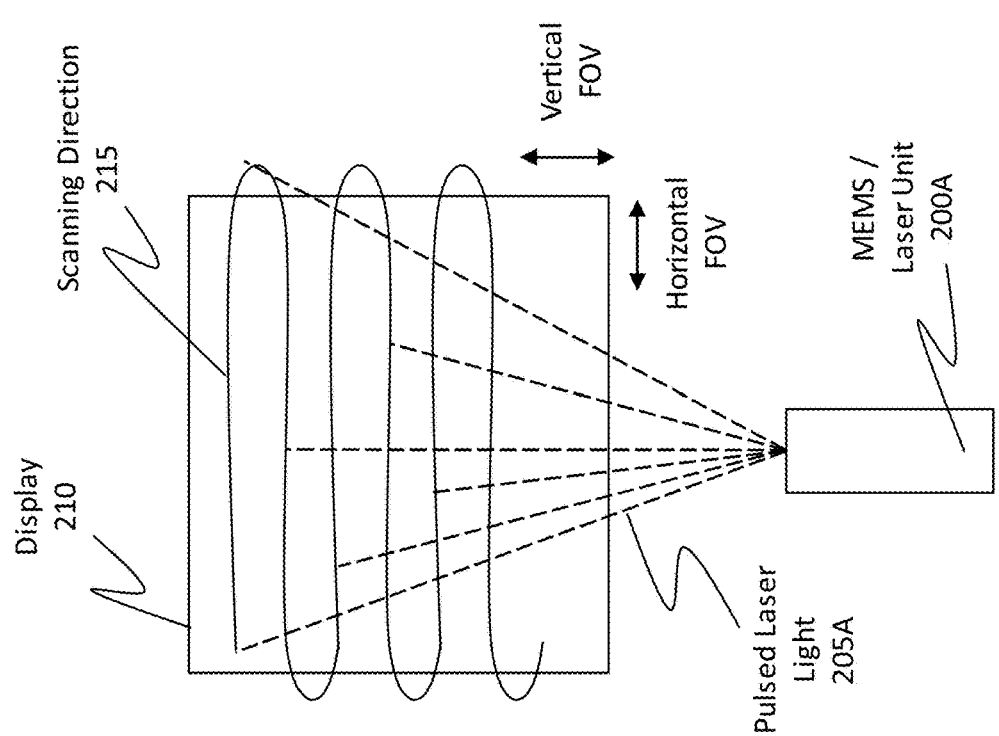
FIG. 2A illustrates a virtual reality display system which can include or be used with the disclosed multi-section laser devices.

Attention is now directed to FIG. 2A, which illustrates one embodiment of a system that utilizes a display 210, such as a VR display, that can utilize the disclosed multi-section laser diodes having integrated photodetectors. As described earlier, in a VR environment, the user's view of the real-world is entirely occluded such that the user is able to see only the VR environment. Here, display 210 is shown as including a vertical field of view ("FOV") and a horizontal FOV. FIG. 2A also shows the progressively backward and forward horizontal and up and down vertical scanning direction 215 in which the MEMS/laser unit 200A is able to scan individual images of a virtual image onto the display 210. By rapidly scanning/rastering the individual pixels, the MEMS/laser unit 200A is able to render an entire virtual image or even an entire VR environment.

Building on the earlier discussion, it will be appreciated that each pixel rastered on the display 210 is generated by pulsing the laser included within the MEMS/laser unit 200A. In this manner, it is possible to illuminate each pixel on display 210 in a pixel-by-pixel basis all the way from the top portion of the display 210 to the bottom portion of the display 210. Consequently, as the MEMS mirror system in the MEMS/laser unit 200A is scanned/aimed to a given pixel position on the display 210, the laser is pulsed to a determined intensity so as to properly illuminate that pixel within the overall virtual image.

Notably, during use, it is important to verify that the laser light 205A has the attributes that are necessary to generate the desired images on the display 210. One way to do that is to measure the individual lasers/light beams that are generated by the RGB laser diodes (not shown), for example, that are integrated in the MEMS/Laser Unit 200A. According to some disclosed embodiments, each of these laser diodes (not shown) are configured as multi-section laser diodes having integrated photodetectors that provide the functionality required to measure/verify the laser light properties, as described herein. Accordingly, it will be appreciated that some embodiments of the disclosed/ claimed invention include mixed-reality systems, such as the VR system shown in FIG. 2A, having MEMS/Laser Units with multi-section laser diodes having integrated photodetectors.

FIG. 2B shows another embodiment of a mixed-reality system (e.g., an AR system) having a MEMS/Laser Unit 200B with one or more multi-section laser diodes (not shown), that each include one or more integrated photodetectors, such as described in reference to FIG. 1B. The AR system of FIG. 2B is similar to the VR system of FIG. 2A. However, instead of scanning pixels on a display (e.g., display 210), the AR system causes its MEMS/laser unit 200B to scan pixels onto the user's eye through the use of a waveguide 220. To illustrate, FIG. 2B shows the MEMS/ laser unit 200B generating pulsed laser light 205B which is directed towards the waveguide 220. This waveguide 220 includes an entry grating 225, through which the pulsed laser light 205B enters the waveguide 220, and an exit grating 230, through which the pulsed laser light 205B exits the waveguide 220. The waveguide 220 is structured to enable the pulsed laser light 205B to propagate through it so that the pulsed laser light 205B can be redirected to a desired location, such as the scanning area 235. In many instances, the scanning area 235 corresponds to a user's eye. In this regard, there is a display module (e.g., the MEMS/laser unit 200B) that shines light into a waveguide (e.g., waveguide 220). Light is then refracted along that waveguide and then coupled out of the waveguide towards the user's eye. As such, instead of scanning light onto the display 210 in the VR scenario, pulsed laser light can be scanned to a user's eye in the AR scenario.

In some instances, the disclosed waveguide is embedded with diffraction gratings that diffract the incident light onto the waveguide and towards the user's eye. Diffraction gratings are inherently sensitive to the spectral characteristics of the illumination source. These types of devices are often highly dependent on the input wavelength and spectral characteristics of the incoming light. Accordingly, as mentioned previously, it can be important to detect/measure the attributes of the laser light with photodetectors. With the current invention, this is now possible to do with photodetectors that are integrated directly into the laser diodes. This can save cost and optimize the space of HMDs for mixed-reality systems.

Figure 3A:
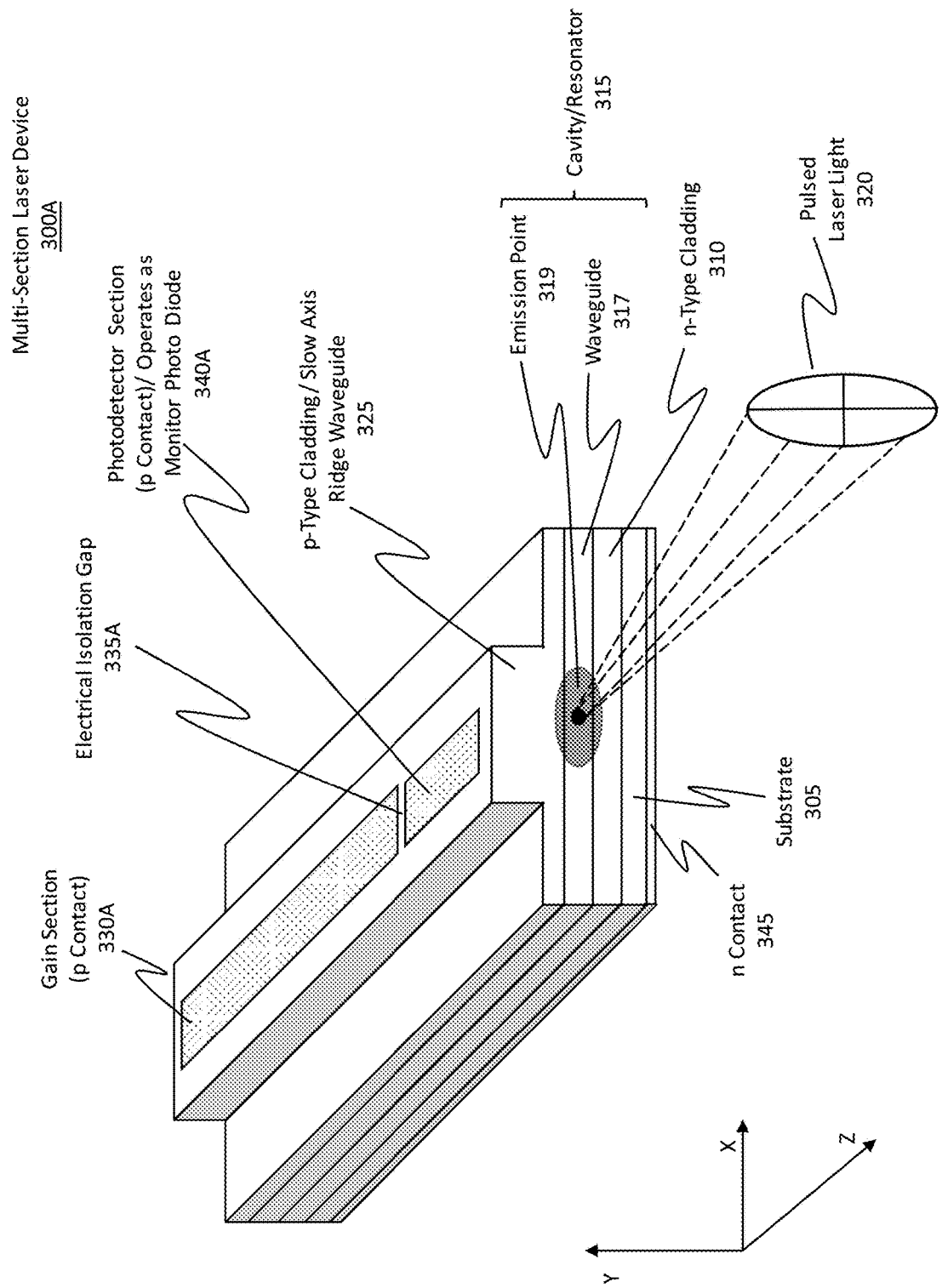
FIG. 3A illustrates a multi-section laser device having a photodetector section positioned between a gain section and a light emitting facet.

Attention is now directed to FIG. 3A, which illustrates an embodiment of a multi-section laser device 300A having an integrated photodetector. As shown, the multi-section laser device 300A includes layers including a substrate 305, n-type cladding 310, cavity/resonator 315, n contact 345 and p-type cladding and slow axis ridge waveguide 325. The photons are confined in the p-type cladding and slow axis ridge waveguide (325) and the emission point region where current is injected (319). The laser emission point 319 acts as an exit point for, in this embodiment, the pulsed laser light 320.

The p-type cladding and slow axis ridge waveguide 325 contains the gain section 330A, the electrical isolation gap 335A and the photodetector section 340A.

As laser light is emitted, it passes through the electrically forward biased gain section 330A, thereby increasing the power and number of photons in the laser light, before the laser light is ultimately passed through the electrical isolation gap 335A. The electrical isolation gap 335A acts as an electrical barrier between the gain section 330A and the photodetector section 340A and which can help prevent interference between the two sections that have opposite biasing.

As the light passes through the electrically reverse biased photodetector section 340A, a portion of the photons from the gain section 330A are siphoned off by photodetector section 340A. The captured/siphoned photons are then used to create a photocurrent that is measured, for example, to reflect a current state of the corresponding light attributes of that laser diode. This measurement can be provided to a control system (e.g., control system 150B) that regulates the power/control of the laser diodes. In this manner, it is possible to use the photocurrent from the integrated photodetector to verify that the light/laser is properly calibrated and/or that can be used to calibrate/adjust the light/laser generated by the multi-section laser device, at the control system. This adjustment may include the control system adjusting and/or refrain from adjusting the power/current settings for the different laser diodes to achieve and/or maintain a desired output from the laser diodes.

Photons generated by the gain section, which are not siphoned off by the photodetector section and turned into photocurrent, finally exit the multi-section laser device through the emission point 319 as the light that is directed to the target collimation and imaging optics for the mixed-reality system(s).

Figure 3B:
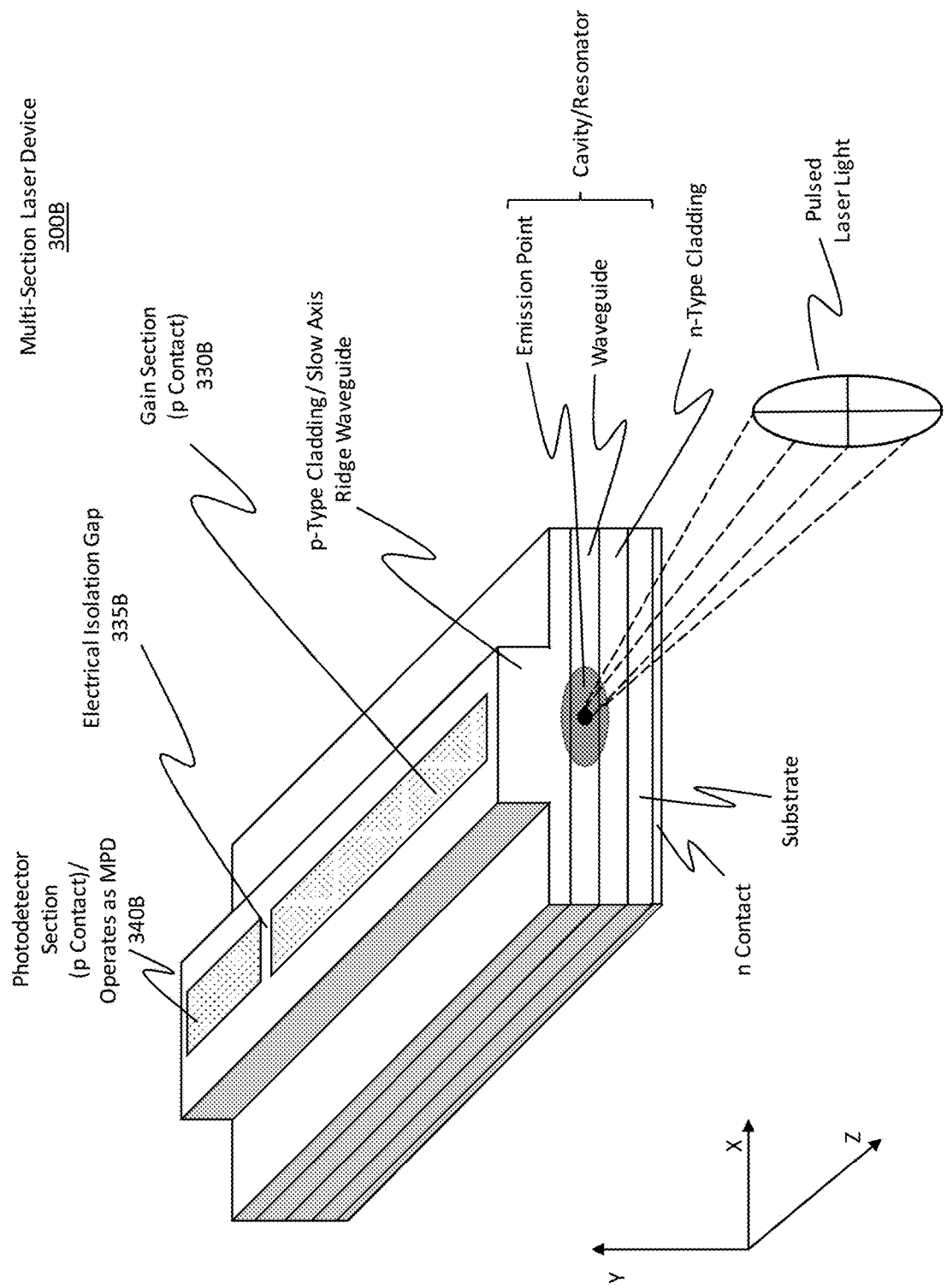
FIG. 3B illustrates a multi-section laser device having a photodetector section and a gain section in a multi-section laser device, where the gain section is positioned between the photodetector section and the light emitting facet of the device.

FIG. 3B illustrates a multi-section laser device 300B that is similar to the multi-section laser device 300A. In this embodiment, the positioning of the integrated photodetector section 340B, the gain section 330B, and electrical isolation gap 335B have been adjusted. In particular, the electrically forward biased gain section 330B is positioned between the photodetector section 340B and the light emitting end of the multi-section laser device 300B.

As laser light is emitted, the electrically reverse biased photodetector section 340B siphons off a portion of the photons produced by the laser and creates a photocurrent that, when measured, enables calculations to determine the power output of the laser. The remaining photons pass through the electrical isolation gap 335B acting as a barrier between the photodetector section 340B and the gain section 330B. Finally, the light travels through the gain section where the output power of the laser and the number of photons is increased before the light exits the multi-section laser device 300B through the emission point 319.

Figure 3C:
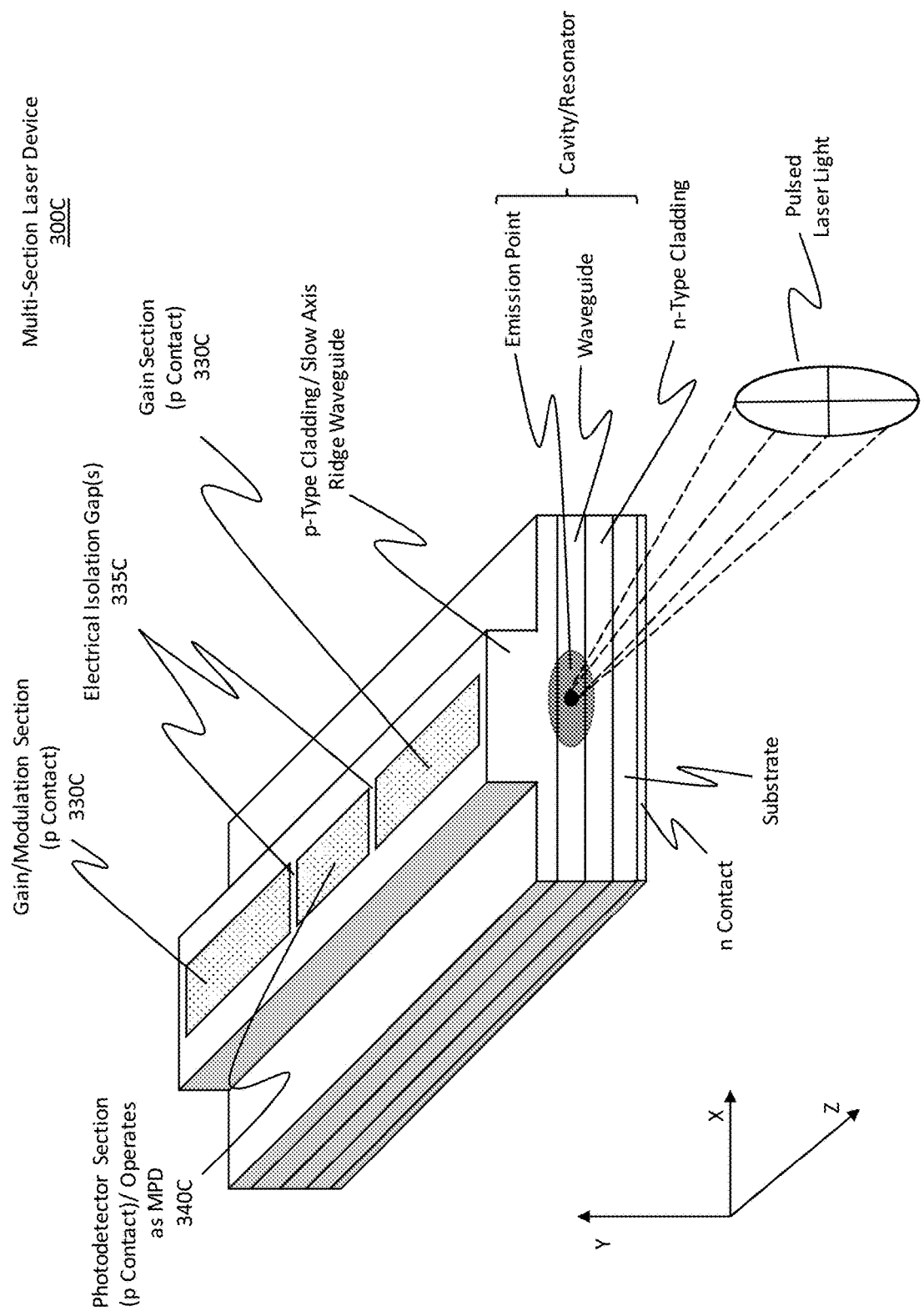
FIG. 3C illustrates a multi-section laser device having a photodetector section and a gain section (comprising two separated portions) with the photodetector section being positioned between the two separated portions of the gain section.

FIG. 3C illustrates another embodiment of a multi-section laser device 300C, which is similar to those described above, having an integrated photodetector. In this embodiment, the gain section 330C is divided into two portions, and there are two electrical isolation gaps 335C, and the photodetector section 340C is positioned between the two portions of the gain section 330C.

As laser light is emitted, it first travels through the first portion of the gain section 330C, where the power and number of photons are increased. The increased power then passes through the first electrical isolation gap 335C. Then, the electrically reverse biased photodetector section 340C, siphons off a portion of the photons created by the first gain section 330C, thereby creating a photocurrent that is used to measure/detect and/or to calculate the power output of the corresponding laser it is integrated into. The remaining photons are then sent through a second isolation gap 335C and into the gain section 330C, where the power is increased one more time before exiting the multi-section laser device 300C through the emission point 319.

Figure 4A:
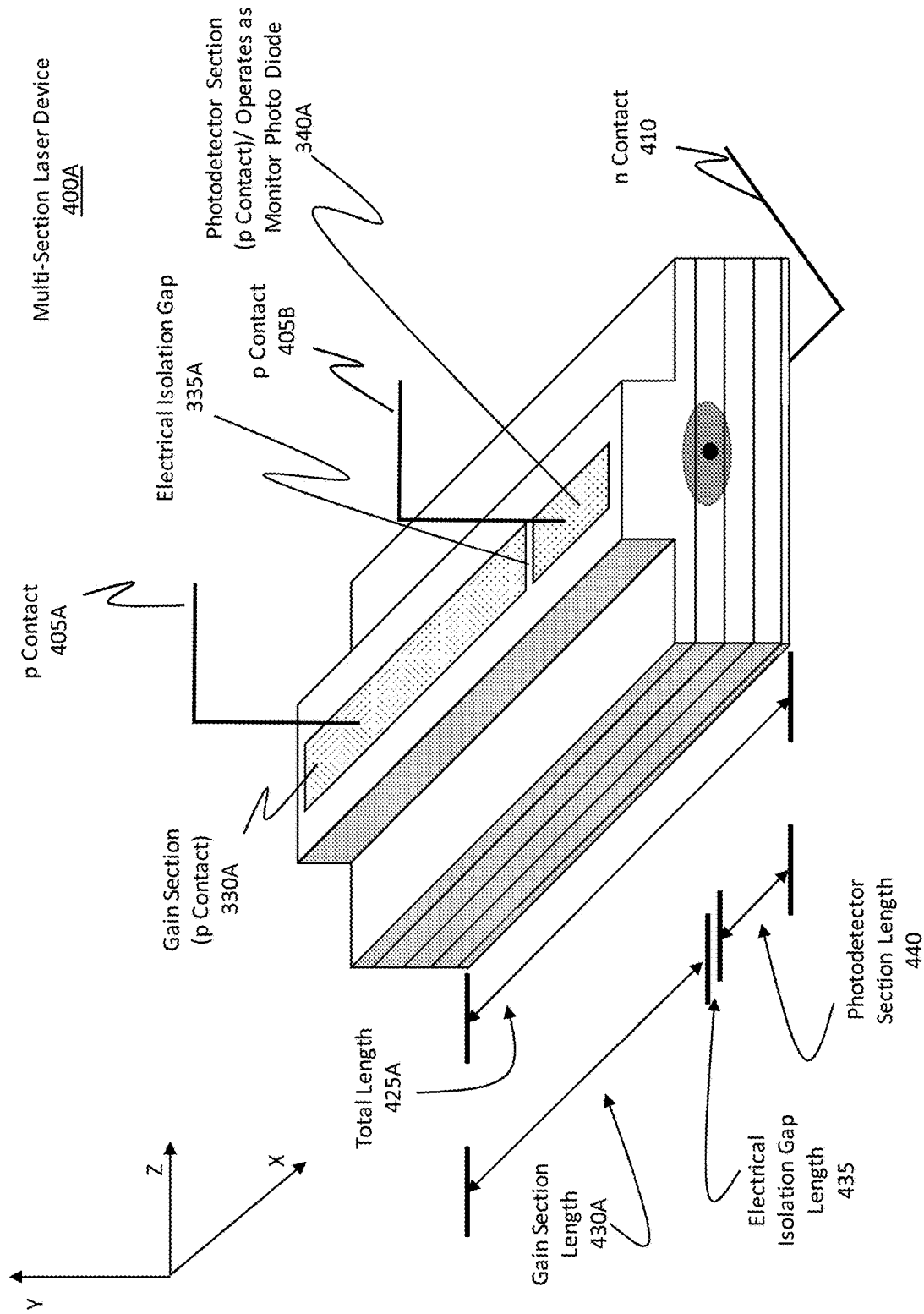
FIG. 4A illustrates another embodiment of a multi-section laser device, which further illustrates possible arrangements of corresponding electrical leads for the multi-section laser device.

FIG. 4A depicts a multi-section laser device 400A with the same structural configuration as the multi-section laser device 300A in FIG. 3A. FIG. 4A shows exemplary lengths 425A of the components of the multi-section laser device 300A.

In some embodiments, if the multi-section laser device 300A is presented as a red multi-section laser device, the total length of the multi-section laser device 300 is a length between about 600 microns and 2 millimeters. In such embodiments, the gain section 330A will preferably be a gain section length 430A (collective length) between about 540 microns and 1.4 millimeters, while the electrical isolation gap 335A will have a preferred electrical isolation gap length 435 of between about 5 and about 10 microns, and while the photodetector section 340A will preferably be a photodetector length of between about 45 and 50 microns.

If the multi-section laser device 300A of FIG. 4A is presented as a green multi-section laser device, however, the green laser device is preferably between about 400 microns to 1.5 millimeters, while the gain section 330A has a preferred length of between about 365 microns and 1.47 millimeters, while the electrical isolation gap 335A has a preferred electrical isolation gap length 435 of between about 5 and about 10 microns, and while the photodetector section 340A will have a preferred photodetector length of between about 5 and 25 microns.

If the multi-section laser device 300A of FIG. 4A is presented as a blue multi-section laser device, the device will have a preferred length of between about 300 microns and 1.5 millimeters, while the gain section 330A will have a preferred section length 430A of between about 265 microns and 1.47 millimeters, while the electrical isolation gap 335A will have a preferred electrical isolation gap length 435 of between about 5 and 10 microns, and while the photodetector section 340A will have a preferred photodetector length of between about 5 and 25 microns.

Because the light intensity of red laser light is higher, the gain section length of a red multi-section laser device 400A does not have to be as long as the gain sections of blue and green multi-section laser devices 400A to create the necessary light to match the output of the blue and green multi-section laser devices 400A. Likewise, because of the higher red laser light intensity, the photodetector section length in a red multi-section laser device 400A, can be larger than those of the green and blue laser diodes/devices. Additionally, because the gain in the blue and green multi-section laser devices 400A is relatively low, while the absorption rate is relatively high, it is important to keep the electrical isolation gap length 435 and the photodetector section length 440 short for the green and blue devices/diodes to mitigate loss.

FIG. 4A depicts an embodiment of a multi-section laser in which electrical contacts 405A, 405B, and 410 are shown. As shown, the gain section 330A is attached to a p contact 405A and the n contact 410, which allow the forward bias of the gain section 330A to be induced with an applied current. The photodetector section 340A is connected to a p contact 405B and then lead 415, which allow the reverse bias of the photodetector section 340A to be induced with an applied current. In this embodiment the p lead 410A of the photodetector section 340A, is attached to electrical circuitry to measure collected photons.

Figure 4B:
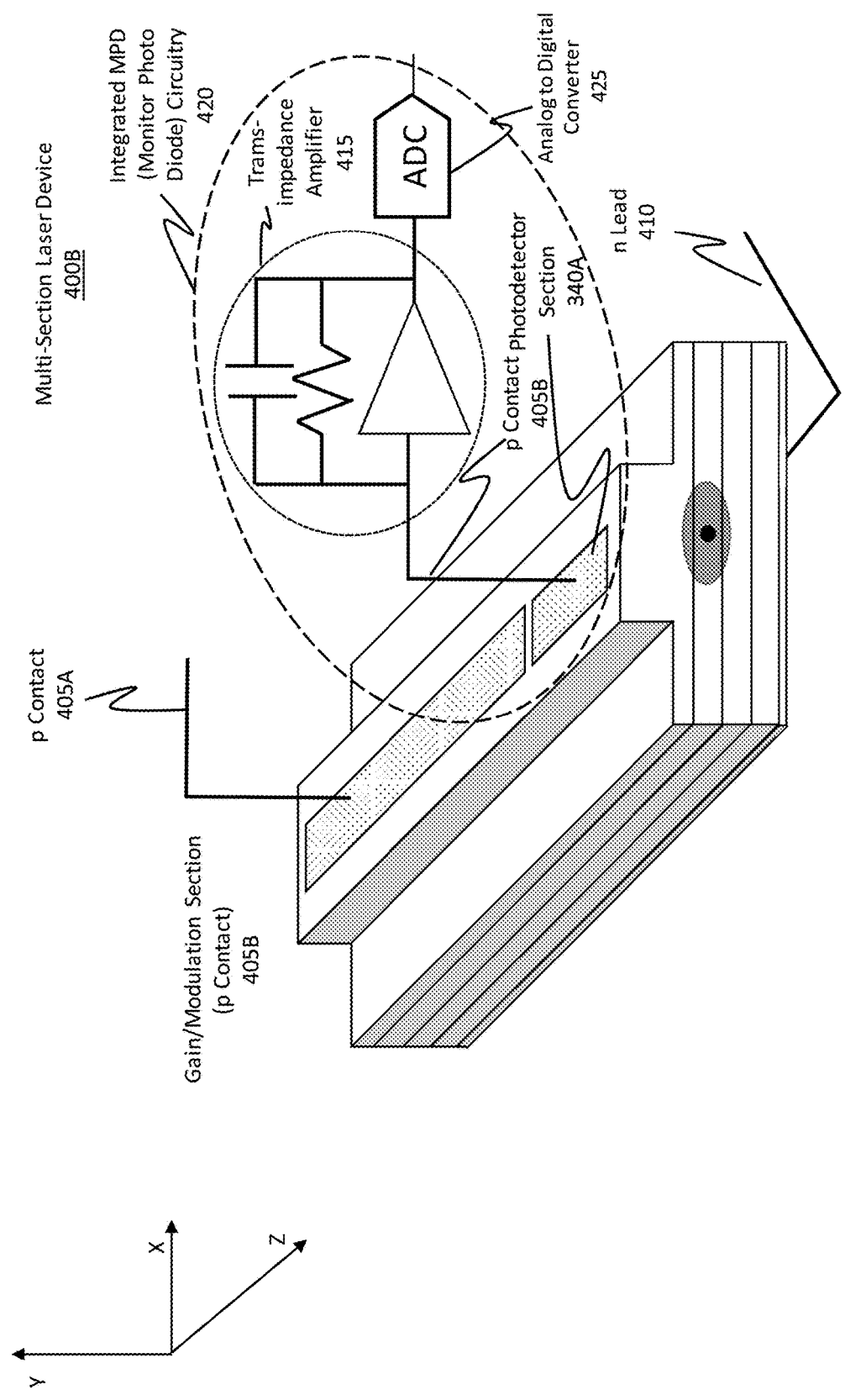
FIG. 4B illustrates another embodiment of a multi-section laser device, along with an embodiment of device circuitry for measuring power output of the multi-section laser device.

FIG. 4B illustrates the multi-section laser device 400B with the same structural configuration of the multi-section laser device 300A in FIG. 3A. In this embodiment, the multi-section laser device 400B features the attached integrated monitor photo diode (MPD) circuitry 420. The integrated MPD circuitry 420 is fed off the p contact 405B of the photodetector section 340A and is connected to a tramsimpedance amplifier 415 which amplifies the photocurrent supplied by the photodetector section 340A. The amplified photocurrent is then fed through an analog to digital converter 425, to create a digital interpretation of the photocurrent. The digital interpretation can then be used, in some instances, to calculate the power output of the device and make calculations to adjust the input current of the multi-section laser device 400B based, in part, on those calculations. Other embodiments may use the digital photocurrent interpretation directly to calculate the new input current base on, at least in part, the digital photocurrent interpretation/calculation/measurement.

Figure 5A:
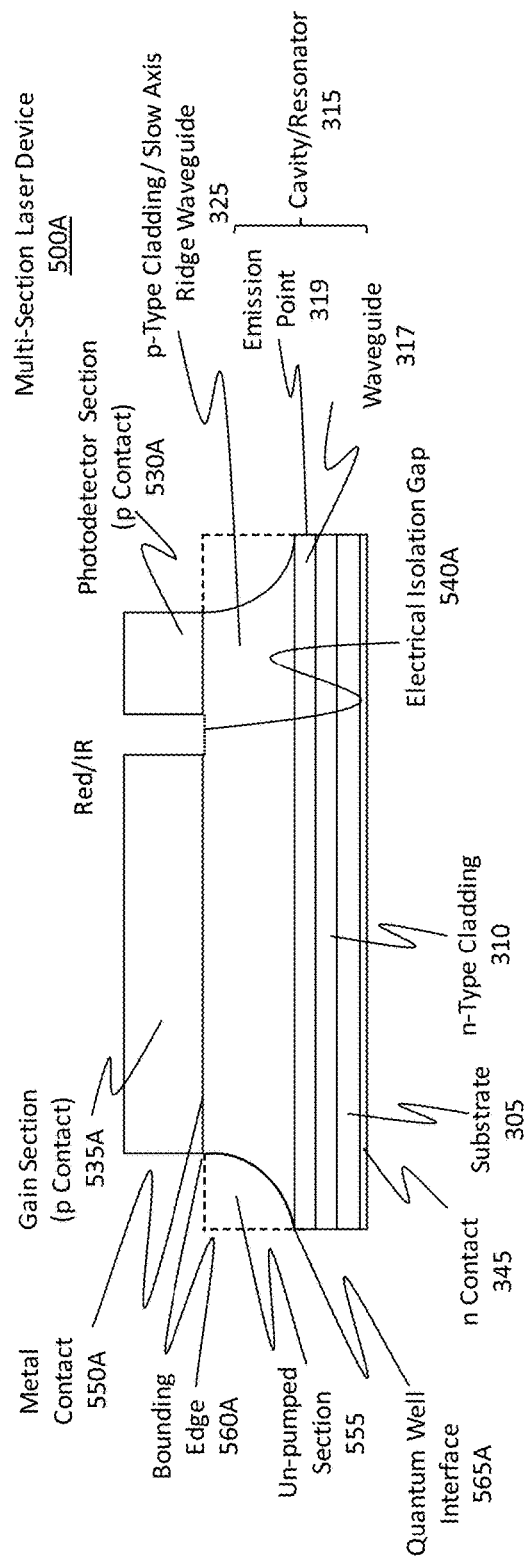
FIGS. 5A and 5B illustrate two side-view embodiments of a multi-section laser device, one with unpumped sections (FIG. 5A) and one without the unpumped sections (FIG. 5B).

FIG. 5A illustrates a side view of a red or infrared multi-section laser device 500A. A multi-section laser device 500A that comprises of a substrate 305, n-type cladding 310, cavity/resonator 315 consisting of a waveguide 317 and an emission point 319, n-type cladding 310 and n contact 345 in layers. The p-type cladding and slow axis ridge waveguide 325, contains an unpumped section 555 in which the p-type cladding and slow axis ridge waveguide 325, is not pumped to make a square edge with a quantum well interface 565A. The unpumped section 555 of the p-type cladding and slow axis ridge waveguide 325 is added to make the multi-section laser device 500A more reliable. By adding the unpumped section 555, the bandgap energy shifts higher than the photo energy of the laser light, preventing catastrophic optical damage. The metal contact 550A extends to the shortened bounding edge 560A instead of the edge of the quantum well interface 565A. The metalization of the gain section 535A and the metalization of the photodetector section 530A, with the electrical isolation gap 540A between them, also end at the bounding edge 560A of the unpumped section 555 of the p-type cladding and slow axis ridge waveguide 325 instead of in line with the edge of the quantum well interface 565A.

Figure 5B:
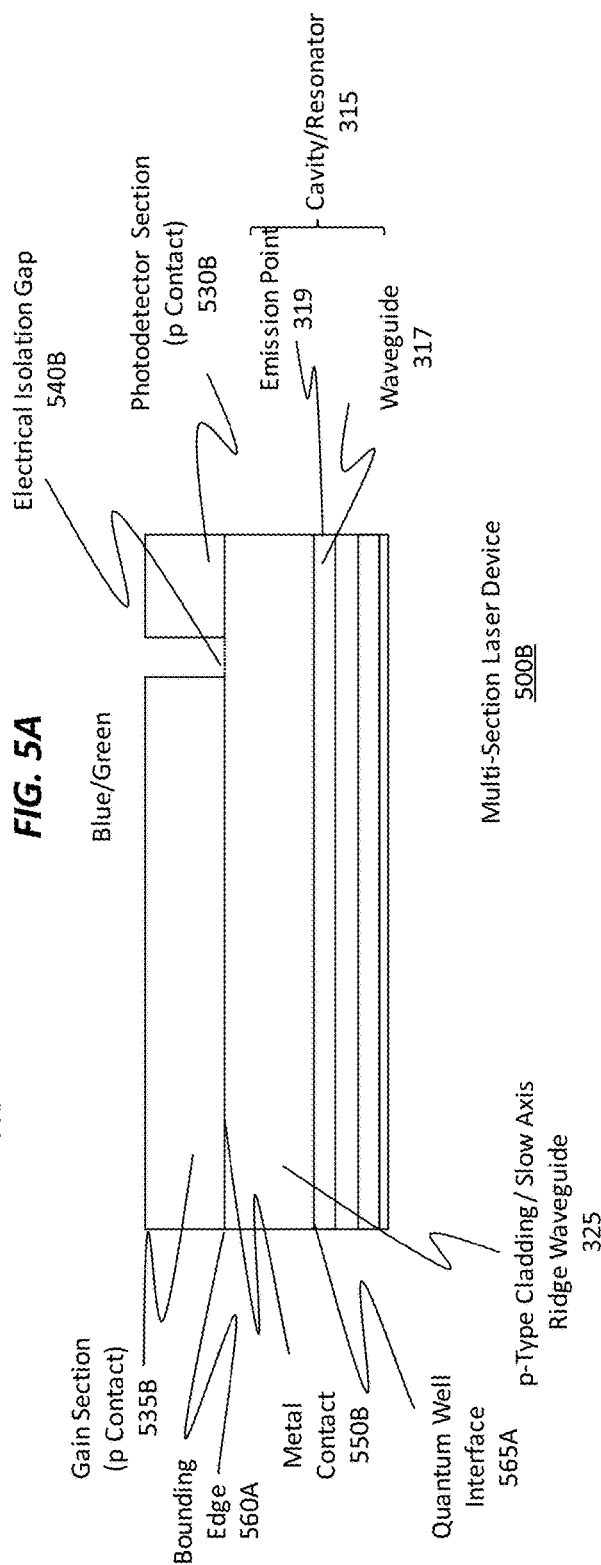

The multi-section laser device 500B of FIG. 5B has the same lower four layers as the multi-section laser device, but the entire p-type cladding and slow axis ridge waveguide layer extends to the edge of the quantum well interface 565A. Because the blue and green laser light doesn't have as much of a risk for catastrophic optical damage, there is no need for an unpumped section (555 of FIG. 5A) to adjust the bandgap energy, allowing the metalization of the gain section 535B, electrical isolation gap 540B and the metalization of the photodetector section 530B to be lined up even with the bounding edge 555 and the edge of the quantum well interface 565A. The metal contact 550B can also extend the full length of the layers of the multi-section laser device 500B.

Figures 6, 7:
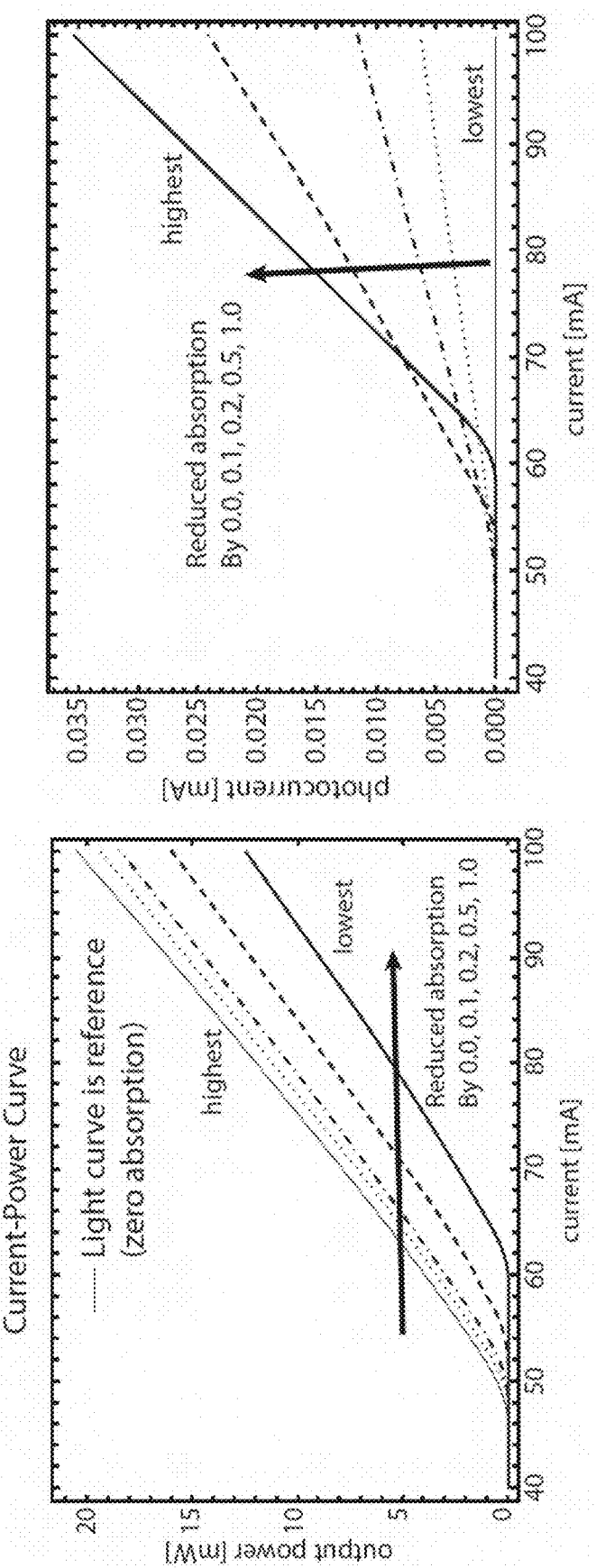
FIG. 6 illustrates a calculated graph of output power based on current supplied to integrated photodetector sections of one or more laser diodes and absorption rates measured at the integrated photodetector sections.
FIG. 7 illustrates a calculated graph of photocurrent output measured from integrated photodetector sections of one or more laser diodes based on the current supplied and the absorption rate of the integrated photodetector sections.

FIG. 6 illustrates a graph comparing drive light and current curves for a green laser with a cavity length of 600 microns. Each line represents a different level of optical absorption in a 10-micron saturable photodetector section. As the current is increased, the power output increases for all optical absorption amounts. Additionally, the graph shows that as the optical absorption rate is increased, the curve of the current to output power graph decreases, indicating the higher the optical absorption, the more current is required to get a higher output power.

FIG. 7 illustrates an exemplary graph comparing drive current applied to photocurrent produced by a photodetector section. In the current example, the photodetector is integrated into a green laser with a 600-micron cavity length and a 10-micron length photodetector section.

The illustrated drive current is applied to a laser to cause the laser to pulse laser light. The photocurrent, on the other hand, is what is measured at/by the photodetector section, as described above. The various lines in the illustration are adjusted levels of optical absorption of the photodetector section. As shown, the highest optical absorption levels are associated with the longest saturation states, which are required to produce the measured photocurrent, as well as the highest photocurrent produced by the drive current.

Figure 8:
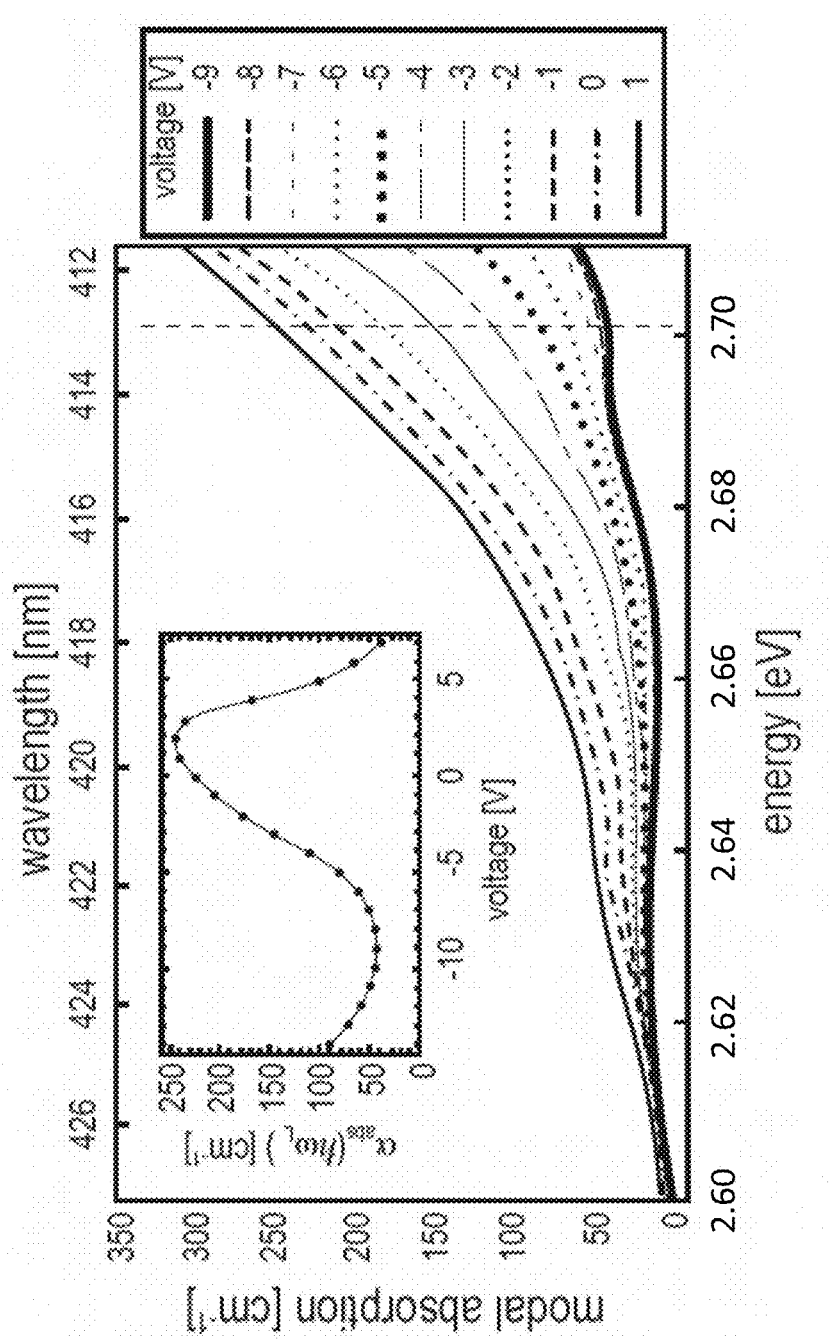
FIG. 8 illustrates a calculated graph of the effect of increases in the reverse bias of an integrated photodetector section on modal absorption for one or more corresponding laser diodes.

FIG. 8 illustrates a graph that shows variations of optical absorption for a laser diode as a function of reverse bias to the detector section. In the present example, the graph specifically corresponds with a near UV blue laser diode. As shown, when the reverse bias of the photodetector section increases (i.e. when the negative voltage applied to the region increases), there is a reduction of the optical loss of the photodetector section which reduces the photocurrent. The graph also shows the various voltages applied and their effect on the energy versus the modal absorption graph. For instance, as the negative voltage increases, there is a decreased absorption per unit of energy applied which decreases optical loss and photocurrent generated.

Figure 9:
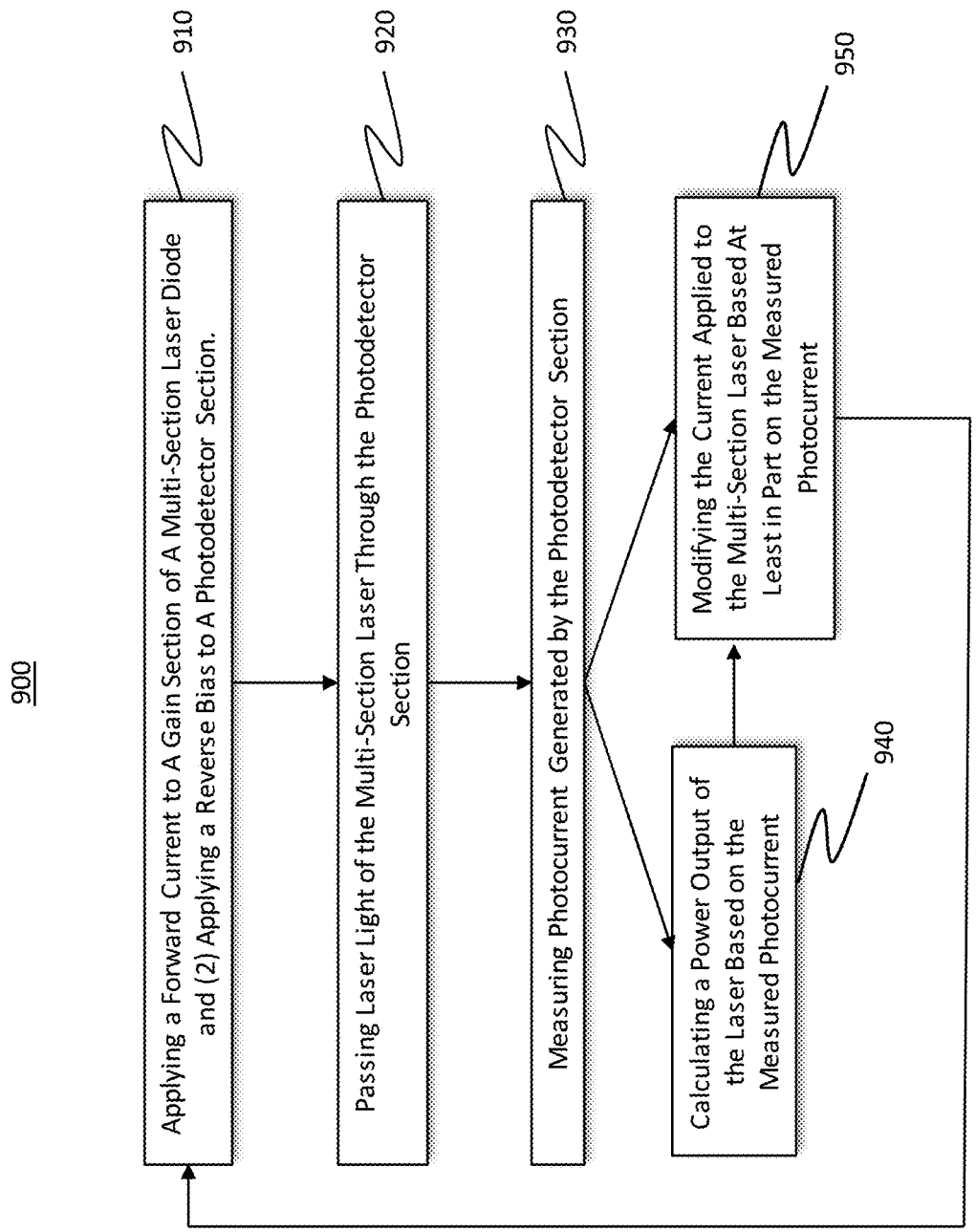
FIG. 9 illustrates an example method for measuring photocurrent for measuring and controlling power output of a multi-section laser device with integrated photodetector components of one or more laser diodes.

FIG. 9 shows a flowchart of acts associated with exemplary methods, such as method 900, for using an integrated photodetector for measuring power output of a multi-section laser device (e.g., the multi-section laser device 112B, 114B, or 116B of FIG. 1B). The multi-section laser photodetector section may be configured in the manner previously described. That is, the photodetector section may be connected to a control system (e.g., the control system 150B of FIG. 1B), which responds to the photocurrent measurements detected from the photodetector section to verify and/or modify power settings for the multi-section laser device, to enable real time adjustments and control of the multi-section laser device.

In act 910, a current is applied to a multi-section laser diode that has a gain section and a photodetector section, to create laser light. In some embodiments, the output power of the multi-section laser must reach at least a minimum value for proper photodetector measurements. Different minimum values will correspond to different laser types and structures.

In act 920, the produced light travels through a photodetector section and a gain section. In one embodiment, the light travels through the gain section prior to passing through the photodetector section. In this embodiment, the power signal that has been amplified by the gain section has to have enough power to saturate the reverse biased photodetector section.

In another embodiment, the light travels through the photodetector section prior to passing through the gain section. In this embodiment, the output power of the light must be large enough to saturate the reverse biased photodetector section prior to any amplification from the gain section.

In an additional embodiment, the power output of the laser goes though partial amplification through a first portion of the gain section before passing through the photodetector section. In this embodiment, the first gain section must be able to output enough power to saturate the reverse biased photodetector.

In act 930, the photocurrent produced by creating by the laser light passing through the photodetector section is measured. After the photocurrent is measured, the system will then (1) calculate the power output of the laser based on the measured photocurrent (act 940) and/or (2) modify the current that is applied to the multi-section laser based at least in part on the measured photocurrent/calculated power output of the laser (act 950). The system will then interactively and/or dynamically apply the current or modified current to the laser (in a feedback loop), in order to control the laser and to cause the laser to, thereby, provide the optimal/desired laser output, as shown and described throughout.

Figure 10:
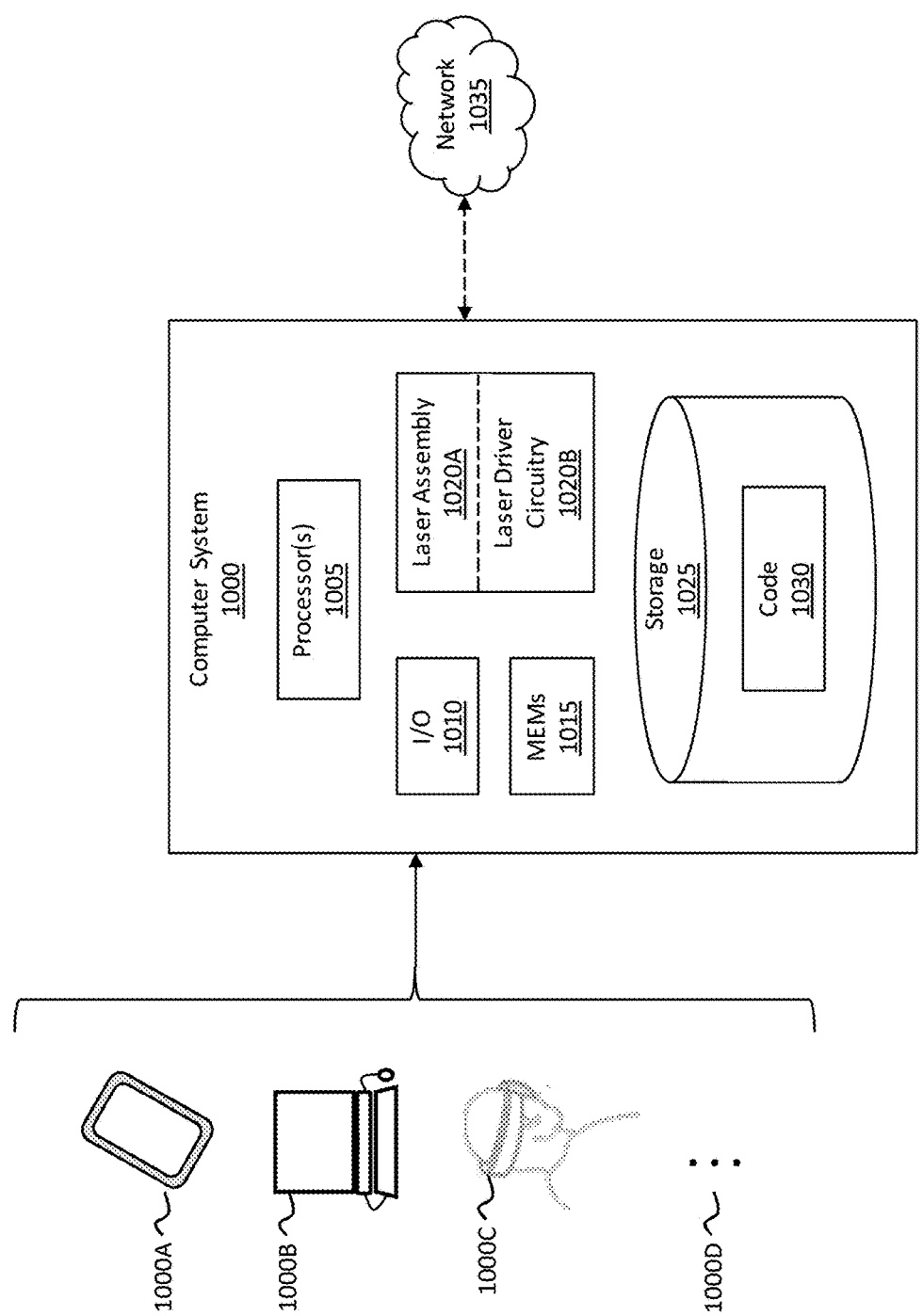
FIG. 10 illustrates an example computer system or display system that can include or be used to implement aspects of the disclosed and claimed embodiments.

Attention will now be directed to FIG. 10 which illustrates an example computer system 1000 that may be used to facilitate the disclosed methods and/or that may comprise one of the disclosed systems. It will be appreciated that computer system 1000 may be configured within various form factors. For example, computer system 1000 may be embodied as a tablet 1000A, a desktop 1000B, or an HMD 1000C. The ellipsis 1000D demonstrates that computer system 1000 may be embodied in various other forms too. For instance, computer system 1000 may also be a distributed system that includes one or more connected computing components/devices that are in communication with computer system 1000, a laptop computer, a mobile phone, a server, a data center, and/or any other computer system. The ellipsis 1000D also indicates that other system subcomponents may be included or attached with the computer system 1000, including, for example, sensors that are configured to detect sensor data such as environmental conditions that may impact the performance of the lasers.

In its most basic configuration, computer system 1000 includes various different components. For example, FIG. 10 shows that computer system 1000 includes at least one processor 1005 (aka a "hardware processing unit"), input/output ("I/O") 1010, a MEMS mirror system 1015, a laser assembly 1020A with laser driver circuitry 1020B (which can include the control systems described herein), and storage 1025.

The MEMS mirror system 1015 may be configured in the manners described throughout this disclosure and may include any number of hardware redirecting mirrors (i.e. relay optics) and actuators. The laser assembly 1020A may include the actual lasers/illuminators discussed throughout this disclosure, and the laser driver circuitry 1020B may include any hardware processors or driving mechanisms used to pump a laser with current.

Storage 1025 is shown as including executable code/instructions 1030. Storage 1025 may be physical system memory, which may be volatile, non-volatile, or some combination of the two. The term "memory" may also be used herein to refer to non-volatile mass storage such as physical storage media. If computer system 1000 is distributed, the processing, memory, and/or storage capability may be distributed as well. As used herein, the term "executable module," "executable component," or even "component" can refer to software objects, routines, or methods that may be executed on computer system 1000. The different components, modules, engines, and services described herein may be implemented as objects or processors that execute on computer system 1000 (e.g. as separate threads).

The disclosed embodiments may comprise or utilize a special-purpose or general-purpose computer including computer hardware, such as, for example, one or more processors (such as processor 1005) and system memory (such as storage 1025), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are physical computer storage media. Computer-readable media that carry computer-executable instructions are transmission media. Thus, by way of example and not limitation, the current embodiments can comprise at least two distinctly different kinds of computer-readable media: computer storage media and transmission media.

Computer storage media are hardware storage devices, such as RANI, ROM, EEPROM, CD-ROM, solid state drives (SSDs) that are based on RANI, Flash memory, phase-change memory (PCM), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

Computer system 1000 may also be connected (via a wired or wireless connection) to external sensors (e.g., one or more remote cameras, accelerometers, gyroscopes, acoustic sensors, magnetometers, temperature sensors, etc.). Further, computer system 1000 may also be connected through one or more wired or wireless networks 1035 to remote systems(s) that are configured to perform any of the processing described with regard to computer system 1000.

During use, a user of computer system 1000 is able to perceive information (e.g., a mixed-reality environment) through a display screen or waveguide that is included with the I/O 1010 of computer system 1000 and that is visible to the user. The I/O interface(s) and sensors with the I/O 1010 also include gesture detection devices, eye trackers, displays, and/or movement detecting components (e.g., cameras, gyroscopes, accelerometers, magnetometers, acoustic sensors, global positioning systems ("GPS"), etc.) that are able to detect positioning and movement of one or more real-world objects, such as a user's hand, a stylus, and/or any other object(s) that the user may interact with while being immersed in the scene.

A graphics rendering engine may also be configured, with processor 1005, to render one or more virtual objects within a mixed-reality scene/environment. As a result, virtual objects can accurately move in response to a movement of the user and/or in response to user input as the user interacts within the virtual scene.

A "network," like the network 1035 shown in FIG. 10, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. Computer system 1000 will include one or more communication channels that are used to communicate with the network 1035. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RANI within a network interface module (e.g., a network interface card or "NIC") and then eventually transferred to computer system RANI and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

Additionally, or alternatively, the functionality described herein can be performed, at least in part, by one or more hardware logic components (e.g., the processor 1005). For example, and without limitation, illustrative types of hardware logic components that can be used include Field-Programmable Gate Arrays (FPGAs), Program-Specific or Application-Specific Integrated Circuits (ASICs), Program-Specific Standard Products (ASSPs), System-On-A-Chip Systems (SOCs), Complex Programmable Logic Devices (CPLDs), Central Processing Units (CPUs), and other types of programmable hardware.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A head-mounted display (HMD), comprising:
    an RGB (red, green, blue) laser assembly comprising respective integrated photodiode sections, the RGB laser assembly comprising:
        a multi-section red laser, comprising:
            a red laser diode having a red laser gain section that is electrically biased in a forward direction; and
            a red laser photodetector section that is electrically biased in a reverse direction, the red laser photodetector section being controllable independently of the red laser gain section, wherein the red laser photodetector section is configured to absorb a portion of the photons generated by the red laser gain section and to generate photocurrent that is proportional to an output power and such that the red laser photodetector section is usable to determine the output power of the red laser diode;
        a multi-section green laser, comprising:
            a green laser diode having a green laser gain section that is electrically biased in a forward direction; and
            a green laser photodetector section that is electrically biased in a reverse direction, the green laser photodetector section being controllable independently of the green laser gain section, wherein the green laser photodetector section is configured to absorb a portion of the photons generated by the green laser gain section and to generate photocurrent that is proportional to an output power and such that the green laser photodetector section is usable to determine the output power of the green laser diode; and
        a multi-section blue laser, comprising:
            a blue laser diode having a blue laser gain section that is electrically biased in a forward direction; and
            a blue laser photodetector section that is electrically biased in a reverse direction, the blue laser photodetector section being controllable independently of the blue laser gain section, wherein the blue laser photodetector section is configured to absorb a portion of the photons generated by the blue laser gain section and to generate photocurrent that is proportional to an output power and such that the blue laser photodetector section is usable to determine the output power of the blue laser diode;
    a microelectromechanical scanning (MEMS) mirror system configured to redirect red laser light, green laser light, and blue laser light generated by the RGB laser assembly;
    a display configured to receive redirected laser light from the MEMS mirror system to form images for display to a user;
    one or more processors; and
    one or more hardware storage devices comprising instructions that are executable by the one or more processors to configure the HMD to:
        apply a forward current to the red laser gain section, the green laser gain section, and the blue laser gain section;
        apply a reverse bias to the red laser photodetector section, the green laser photodetector section, and the blue laser photodetector section;
        measure photocurrent from the red laser photodetector section based on photons generated by the red laser gain section and absorbed by the red laser photodetector section within the multi-section red laser;
        measure photocurrent from the green laser photodetector section based on photons generated by the green laser gain section and absorbed by the green laser photodetector section within the multi-section green laser;
        measure photocurrent from the blue laser photodetector section based on photons generated by the blue laser gain section and absorbed by the blue laser photodetector section within the multi-section blue laser;
        selectively modify the forward current applied to the red laser gain section, the green laser gain section, and the blue laser gain section based, respectively, on the photocurrent from the red laser photodetector section of the multi-section red laser, the photocurrent from the green laser photodetector section of the multi-section green laser, and the photocurrent from the blue laser photodetector section of the multi-section blue laser; and
        use the MEMS mirror system to redirect light emitted by applying the selectively modified forward current to the red laser gain section, the green laser gain section, and the blue laser gain section toward the display to generate an image on the display.

2. The HMD of claim 1, wherein:
    the red laser photodetector section is positioned between the red laser gain section and a red laser light emitting facet of the multi-section red laser, the green laser photodetector section is positioned between the green laser gain section and a green laser light emitting facet of the multi-section green laser, or the blue laser photodetector section is positioned between the blue laser gain section and a blue laser light emitting facet of the multi-section blue laser.

3. The HMD of claim 2, wherein:
the multi-section red laser comprises a red laser unpumped section, wherein the red laser photodetector section is positioned directly adjacent to the red laser unpumped section of the multi-section red laser such that the red laser photodetector section and the red laser unpumped section share a common bounding edge, the multi-section green laser comprises a green laser unpumped section, wherein the green laser photodetector section is positioned directly adjacent to the green laser unpumped section of the multi-section green laser such that the green laser photodetector section and the green laser unpumped section share a common bounding edge, or the multi-section blue laser comprises a blue laser unpumped section, wherein the blue laser photodetector section is positioned directly adjacent to the blue laser unpumped section of the multi-section blue laser such that the blue laser photodetector section and the blue laser unpumped section share a common bounding edge.

4. The HMD of claim 1, wherein:
the red laser gain section is positioned between the red laser photodetector section and a red laser light emitting facet of the multi-section red laser, the green laser gain section is positioned between the green laser photodetector section and a green laser light emitting facet of the multi-section green laser, or the blue laser gain section is positioned between the blue laser photodetector section and a blue laser light emitting facet of the multi-section blue laser.

5. The HMD of claim 1, wherein:
the red laser photodetector section is positioned between a first portion of the red laser gain section and a second portion of the red laser gain section, the green laser photodetector section is positioned between a first portion of the green laser gain section and a second portion of the green laser gain section, or the blue laser photodetector section is positioned between a first portion of the blue laser gain section and a second portion of the blue laser gain section.

6. The HMD of claim 1, wherein the red laser photodetector section, the green laser photodetector section, or the blue laser photodetector section is electrically connected to a trams-impedance amplifier and an ADC (analog to digital converter).

7. The HMD of claim 1, wherein an electrical isolation gap exists between the red laser photodetector section and the red laser gain section, between the green laser photodetector section and the green laser gain section, or between the blue laser photodetector section and the blue laser gain section.

8. The HMD of claim 7, wherein the electrical isolation gap comprises a distance of electrical isolation of between 5 microns and 10 microns.

9. The HMD of claim 1, wherein a length of the red laser photodetector section, the green laser photodetector section, or the blue laser photodetector section is in a range of between 5 microns and 50 microns.

10. The HMD of claim 1, wherein:
the red laser photodetector section is defined by a length that is less than 10% of a length of the red laser gain section, the green laser photodetector section is defined by a length that is less than 10% of a length of the green laser gain section, or the blue laser photodetector section is defined by a length that is less than 10% of a length of the blue laser gain section.

11. A method for displaying an image on a head-mounted display (HMD), the method comprising:
applying a forward current to a red laser gain section of a multi-section red laser, a green laser gain section of a multi-section green laser, and a blue laser gain section of a multi-section blue laser, wherein the multi-section red laser, the multi-section green laser, and the multi-section blue laser are components of an RGB (red, green, blue) laser assembly, and wherein:

the multi-section red laser comprises:
a red laser diode having the red laser gain section that is electrically biased in a forward direction; and
a red laser photodetector section that is electrically biased in a reverse direction, the red laser photodetector section being controllable independently of the red laser gain section, wherein the red laser photodetector section is configured to absorb a portion of the photons generated by the red laser gain section and to generate photocurrent that is proportional to an output power and such that the red laser photodetector section is usable to determine the output power of the red laser diode, the multi-section green laser comprises:
a green laser diode having the green laser gain section that is electrically biased in a forward direction; and
a green laser photodetector section that is electrically biased in a reverse direction, the green laser photodetector section being controllable independently of the green laser gain section, wherein the green laser photodetector section is configured to absorb a portion of the photons generated by the green laser gain section and to generate photocurrent that is proportional to an output power and such that the green laser photodetector section is usable to determine the output power of the green laser diode, and the multi-section blue laser comprises:
a blue laser diode having the blue laser gain section that is electrically biased in a forward direction; and
a blue laser photodetector section that is electrically biased in a reverse direction, the blue laser photodetector section being controllable independently of the blue laser gain section, wherein the blue laser photodetector section is configured to absorb a portion of the photons generated by the blue laser gain section and to generate photocurrent that is proportional to an output power and such that the blue laser photodetector section is usable to determine the output power of the blue laser diode;

applying a reverse bias to the red laser photodetector section, the green laser photodetector section, and the blue laser photodetector section;

measuring photocurrent from the red laser photodetector section based on photons generated by the red laser gain section and absorbed by the red laser photodetector section within the multi-section red laser;

measuring photocurrent from the green laser photodetector section based on photons generated by the green laser gain section and absorbed by the green laser photodetector section within the multi-section green laser;

measuring photocurrent from the blue laser photodetector section based on photons generated by the blue laser gain section and absorbed by the blue laser photodetector section within the multi-section blue laser;

selectively modifying the forward current applied to the red laser gain section, the green laser gain section, and the blue laser gain section based, respectively, on the photocurrent from the red laser photodetector section of the multi-section red laser, the photocurrent from the green laser photodetector section of the multi-section green laser, and the photocurrent from the blue laser photodetector section of the multi-section blue laser; and using a microelectromechanical scanning (MEMS) mirror system to redirect light emitted by applying the selectively modified forward current to the red laser gain section, the green laser gain section, and the blue laser gain section toward a display of an HMD to generate an image on the display of the HMD.

12. The method of claim 11, wherein:
the red laser photodetector section is positioned between the red laser gain section and a red laser light emitting facet of the multi-section red laser,
the green laser photodetector section is positioned between the green laser gain section and a green laser light emitting facet of the multi-section green laser, or
the blue laser photodetector section is positioned between the blue laser gain section and a blue laser light emitting facet of the multi-section blue laser.

13. The method of claim 12, wherein:
the multi-section red laser comprises a red laser unpumped section, wherein the red laser photodetector section is positioned directly adjacent to the red laser unpumped section of the multi-section red laser such that the red laser photodetector section and the red laser unpumped section share a common bounding edge,
the multi-section green laser comprises a green laser unpumped section, wherein the green laser photodetector section is positioned directly adjacent to the green laser unpumped section of the multi-section green laser such that the green laser photodetector section and the green laser unpumped section share a common bounding edge, or
the multi-section blue laser comprises a blue laser unpumped section, wherein the blue laser photodetector section is positioned directly adjacent to the blue laser unpumped section of the multi-section blue laser such that the blue laser photodetector section and the blue laser unpumped section share a common bounding edge.

14. The method of claim 11, wherein:
the red laser gain section is positioned between the red laser photodetector section and a red laser light emitting facet of the multi-section red laser,
the green laser gain section is positioned between the green laser photodetector section and a green laser light emitting facet of the multi-section green laser, or
the blue laser gain section is positioned between the blue laser photodetector section and a blue laser light emitting facet of the multi-section blue laser.

15. The method of claim 11, wherein:
the red laser photodetector section is positioned between a first portion of the red laser gain section and a second portion of the red laser gain section,
the green laser photodetector section is positioned between a first portion of the green laser gain section and a second portion of the green laser gain section, or
the blue laser photodetector section is positioned between a first portion of the blue laser gain section and a second portion of the blue laser gain section.

16. The method of claim 11, wherein the red laser photodetector section, the green laser photodetector section, or the blue laser photodetector section is electrically connected to a trams-impedance amplifier and an ADC (analog to digital converter).

17. The method of claim 11, wherein an electrical isolation gap exists between the red laser photodetector section and the red laser gain section, between the green laser photodetector section and the green laser gain section, or between the blue laser photodetector section and the blue laser gain section.

18. The method of claim 17, wherein the electrical isolation gap comprises a distance of electrical isolation of between 5 microns and 10 microns.

19. The method of claim 11, wherein a length of the red laser photodetector section, the green laser photodetector section, or the blue laser photodetector section is in a range of between 5 microns and 50 microns.

20. The method of claim 11, wherein:
the red laser photodetector section is defined by a length that is less than 10% of a length of the red laser gain section,
the green laser photodetector section is defined by a length that is less than 10% of a length of the green laser gain section, or
the blue laser photodetector section is defined by a length that is less than 10% of a length of the blue laser gain section.

* * * * *